(12) United States Patent
Jin et al.

(10) Patent No.: US 6,642,786 B1
(45) Date of Patent: Nov. 4, 2003

(54) PIECEWISE POLYNOMIAL PREDISTORTION METHOD AND APPARATUS FOR COMPENSATING NONLINEAR DISTORTION OF HIGH POWER AMPLIFIER

(75) Inventors: Minglu Jin, Taejon (KR); Sooyoung Kim, Taejon (KR); Deockgil Oh, Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 10/222,629

(22) Filed: Aug. 15, 2002

(51) Int. Cl.$^7$ ................................................. H03F 1/26
(52) U.S. Cl. ...................................................... 330/149
(58) Field of Search ............................. 330/2, 107, 149

(56) References Cited

U.S. PATENT DOCUMENTS

| | | | |
|---|---|---|---|
| 5,900,778 A | 5/1999 | Stonick et al. | |
| 6,072,364 A | 6/2000 | Jeckeln et al. | |
| 6,075,411 A * | 6/2000 | Briffa et al. | 330/149 |
| 6,236,837 B1 | 5/2001 | Midya | |
| 6,240,278 B1 * | 5/2001 | Midya et al. | 455/126 |
| 6,437,644 B1 * | 8/2002 | Kenington | 330/149 |
| 6,504,425 B1 * | 1/2003 | Kim | 330/2 |
| 6,549,067 B1 * | 4/2003 | Kenington | 330/52 |
| 6,583,739 B1 * | 6/2003 | Kenington | 341/118 |

FOREIGN PATENT DOCUMENTS

KR 2001-0064260 7/2001

\* cited by examiner

Primary Examiner—My-Trang Nu Ton
(74) Attorney, Agent, or Firm—Blakely, Sokoloff, Taylor & Zafman

(57) ABSTRACT

A piecewise polynomial predistortion method and apparatus compensates nonlinear distortion of a high power amplifier by including an amplitude predistortion circuit for predistorting an input amplitude signal based on first polynomial coefficients corresponding to the amplitude of the input amplitude signal to provide a predistorted amplitude signal, a phase predistortion circuit for predistorting an input phase signal based on the predistorted amplitude signal and second polynomial coefficients corresponding to the amplitude of the predistorted amplitude signal to provide a predistorted phase signal, a power amplifier for amplifying the predistorted amplitude and phase signal to output an amplified amplitude and phase signal, a first adaptation circuit for updating the first polynomial coefficients based on the predistorted amplitude signal and the amplified amplitude signal and a second adaptation circuit for updating the second polynomial coefficients based on the predistorted amplitude signal, the predistorted phase signal and the amplified phase signal.

22 Claims, 7 Drawing Sheets

PIECEWISE POLYNOMIAL PREDISTORTION METHOD AND APPARATUS FOR COMPENSATING NONLINEAR DISTORTION OF HIGH POWER AMPLIFIER

FIELD OF THE INVENTION

The present invention relates to a linearization method and apparatus for a high power amplifier (HPA) used for data transmission in digital communication systems; and, more particularly, to a piecewise polynomial predistortion method and apparatus for compensating nonlinear distortion of the high power amplifier.

DESCRIPTION OF RELATED ARTS

Power efficiency and spectrum efficiency are the main concern in modern digital communication systems. The spectrum efficiency requires the system to be more linear while the power efficiency requires the system using an amplifier with nonlinear characteristics. So how to tradeoff between these two conflict factors is a challenge to communication engineers.

Generally, a nonlinear characteristic of a high power amplifier (HPA) is represented by a range of power-in vs. power-out curve. The power-in vs. power-out curves for HPAs are also called amplitude-dependent amplitude distortion (AM/AM) transfer curves.

FIG. 1 shows a typical power-in vs. power-out characteristic of a nonlinear HPA. In addition to the AM/AM transfer curves, manufacturers also provide phase shift properties. A phase shift is imparted to a signal depending on a drive level. The phase shift curve is also called an amplitude-dependent phase distortion (AM/PM) conversion curve.

Ideally it is required to operate the HPA at saturation because the most power is obtained from the HPA operating at saturation. But it is found that the nonlinear characteristic of the HPA causes significant signal distortion at saturation, so the communication engineers back off from this desired optimum, resulting in inefficient use of power.

The linearization of the HPA is the most effective method to overcome this difficulty. Over the years, a number of linearization technologies have been developed and predistortion has been the most common approach developed in new systems today.

Basically, these techniques aim to introduce "inverse" nonlinearities that can compensate the AM/AM and AM/PM distortions generated by the nonlinear HPA. The predistortion device uses a memoryless nonlinear device placed usually between a shaping filter and the HPA. This nonlinear device can be designed digitally by using a mapping predistorter (a look-up table) or a polynomial function based on Cartesian or Polar representation.

The mapping predistorter has an advantage that it can be applied to any order of nonlinearity and any modulation technique. However, to get an acceptable accuracy, the size of the look-up table has to be high enough. So a major drawback with the mapping predistorter is the large size of the look-up table, which results in a long adaptation time.

Therefore, in order to increase the rate of convergence and to reduce the complexity, several adaptive polynomial predistorters have been proposed.

For example, U.S. Pat. No. 6,236,837, entitled "Polynomial Predistortion Linearizing Device, Method, Phone and Base Station", discloses a polynomial based predistortion method. The key idea of this patent is that the inverse characteristic of the HPA is approximated by the orthogonal polynomial functions expansion and the coefficient of the expansions is estimated by an orthogonal estimation algorithm. The primary objective of this patent is to realize the predistortion with medium or high accuracy depending on the application while minimizing the computational requirements. One feature of this predistortion is the orthogonal polynomial decomposition based on input signal statistical distribution. The computational complexity is increased by the use of orthogonal polynomial compared to methods that use a single non-decomposed polynomial function.

U.S. Pat. No. 5,900,778, entitled "Adaptive Parametric Signal Predistorter for Compensation of Time Varying Linear and Nonlinear Amplifier Distortion", discloses a polynomial based predistortion method. In this patent, the predistortion is implemented by two look-up tables whose contents are updated by an off-line adaptive predistorter and the forward and inverse characteristics of the HPA are approximated by the polynomial functions. The primary objective of this patent is to overcome some problems of prior art; utilizing the smallest number of HPA output data to determine the best inverse to the output of the HPA where it is most needed, sensitivity to measurements error, and absence of gradients of AM/AM functions. However, the computational complexity of this patent is much larger than the others.

U.S. Pat. No. 6,072,364, entitled "Adaptive Digital Predistortion for Power Amplifiers with Real Time Modeling of Memoryless Complex Gain", discloses a polynomial based predistortion method. In this patent, the forward function of HPA and its inverse functions are estimated by a line or cubic spline interpolation method and the update operation is performed in a block manner, so that it is possible to eliminate the convergence time and the need for an iterative algorithm. However, this patent is sensitive to the measurements error.

Korean laid-open patent publication No. 2001-064260, entitled "Adaptive Predistorter for Non-linear Distortion Compensation", discloses a polynomial based predistortion method. In this patent application, the inverse function of HPA is approximated by the polynomial function and the coefficients of the polynomial are estimated by a least mean-square (LMS) algorithm. The primary objective of the this application is to reduce the required memory size and to speed up the convergence time The performance of polynomial predistortion is highly dependent on the accuracy of the function models used. The order of polynomial must be increased for the performance improvement, resulting in increasing the computational complexity. In addition to this, the errors generated by the polynomial predistortion function are mainly contributed by the signal in the regions of saturation or cutoff.

FIG. 1 shows a plot of the AM/AM transfer function of the HPA and generally a large signal power amplifier device may be characterized by three regions of operations: cut-off, linear or active and saturation regions.

In general, the properties of the amplifier exploit distinct characteristics in each of the three regions and it is very difficult to approximate the function of AM/AM (or AM/PM) by using a single polynomial in the whole input signal regions with a small order of polynomial.

SUMMARY OF THE INVENTION

It is, an objective of the present invention to provide a method and apparatus for modeling a high power amplifier with piecewise polynomial functions in different regions of an input signal to thereby overcome the above-discussed and other problems of the prior art.

To increase the performance of the conventional polynomial based predistortion, the degree of the polynomial functions must be increased and this results in increasing computational complexity.

Generally, most of the power amplifiers may be characterized by three regions of operations: cut-off, linear or active and saturation regions and the amplifier exploits distinct properties in each region. Therefore, it is very difficult to approximate a transfer function of the amplifier with a lower degree of polynomial functions and in some cases it is almost impossible to do so.

To overcome this problem, in accordance with the present invention, the input signal region is divided into several sub-regions. In practical applications, it is very important to select the number of sub-regions, the sub-region points and the degree of the polynomial functions in each sub-region to tradeoff between the performance and complexity. In accordance with the present invention, the selection of these parameters is based on the input signal distribution and characteristics of the amplifier. The LMS algorithm is used in order to achieve the minimum approximation error.

In accordance with one aspect of the present invention, there is provided a polynomial predistortion apparatus, comprising: an amplitude predistortion circuit for predistorting an input amplitude signal based on first polynomial coefficients selected according to the amplitude of the input amplitude signal to thereby provide a predistorted amplitude signal; a phase predistortion circuit for predistorting an input phase signal based on the predistorted amplitude signal and second polynomial coefficients selected according to the amplitude of the predistorted amplitude signal to thereby provide a predistorted phase signal; a power amplifier for amplifying the predistorted amplitude signal and the predistorted phase signal to thereby output an amplified amplitude signal and an amplified phase signal; a first adaptation circuit for updating the first polynomial coefficients based on the predistorted amplitude signal and the amplified amplitude signal; and a second adaptation circuit for updating the second polynomial coefficients based on the predistorted amplitude signal, the predistorted phase signal and the amplified phase signal.

In accordance with another aspect of the present invention, there is provided a polynomial predistortion method, comprising the steps of: (a) receiving an input amplitude signal and phase signal; (b) predistorting the input amplitude signal by using first polynomial coefficients selected according to the amplitude of the input amplitude signal to generate a predistorted amplitude signal; (c) predistorting the input phase signal by using the predistorted amplitude signal and second polynomial coefficients selected according to the amplitude of the predistorted amplitude signal to produce a predistorted phase signal; (d) amplifying the predistorted amplitude signal and the predistorted phase signal to provide an amplified amplitude signal and an amplified phase signal; (e) updating the first polynomial coefficients by using the predistorted amplitude signal and the amplified amplitude signal; and (f) updating the second polynomial coefficients by using the predistorted amplitude signal, the predistorted phase signal and the amplified phase signal.

BRIEF DESCRIPTION OF THE DRAWING(S)

The above and other objects and features of the present invention will become apparent from the following description of the preferred embodiments given in conjunction with the accompanying drawings, in which:

FIG. 1 exemplifies a plot showing input and output amplitudes of a power AM/AM transfer function of a high power amplifier;

Figure 4A:
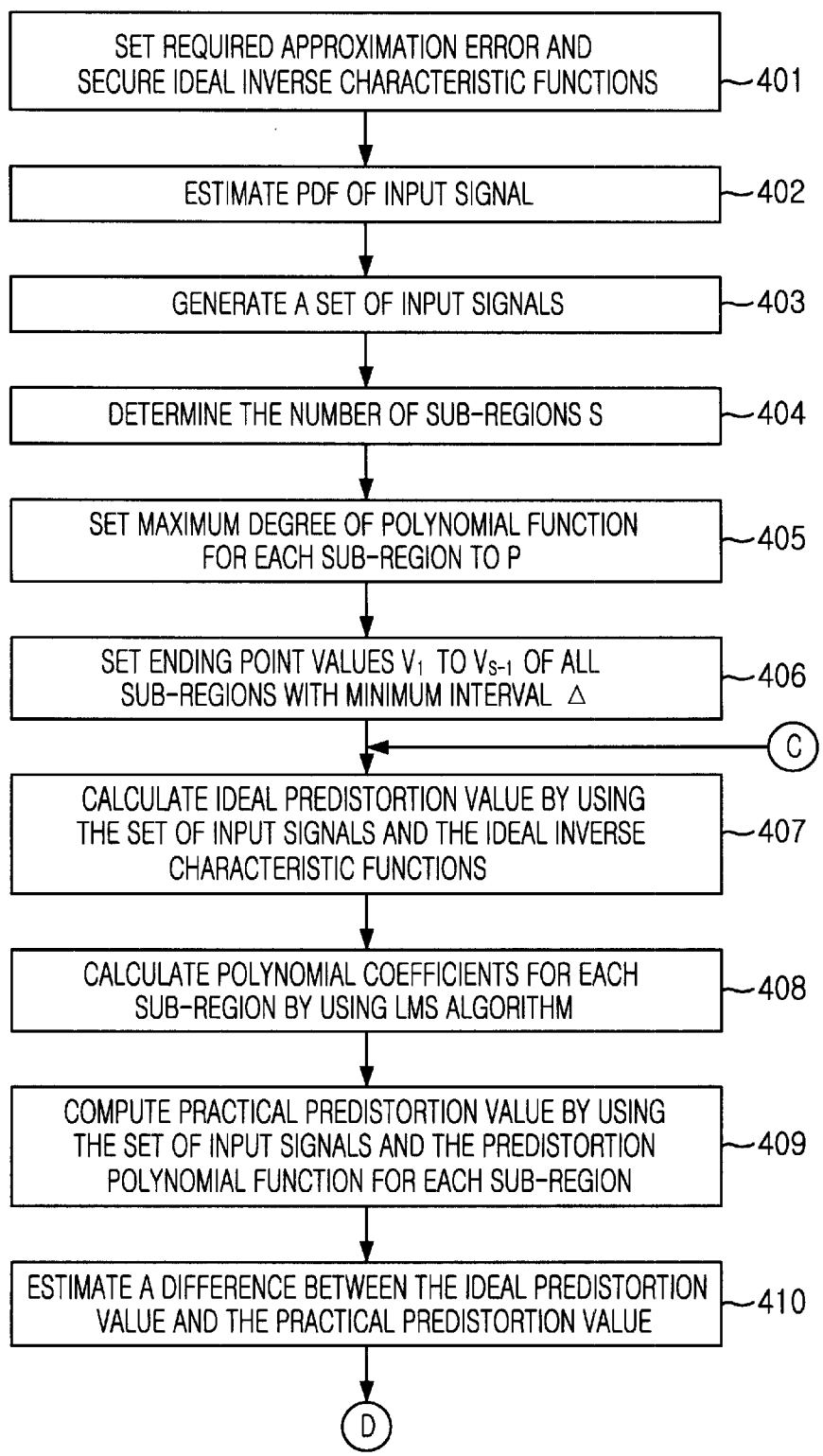
Figure 4B:
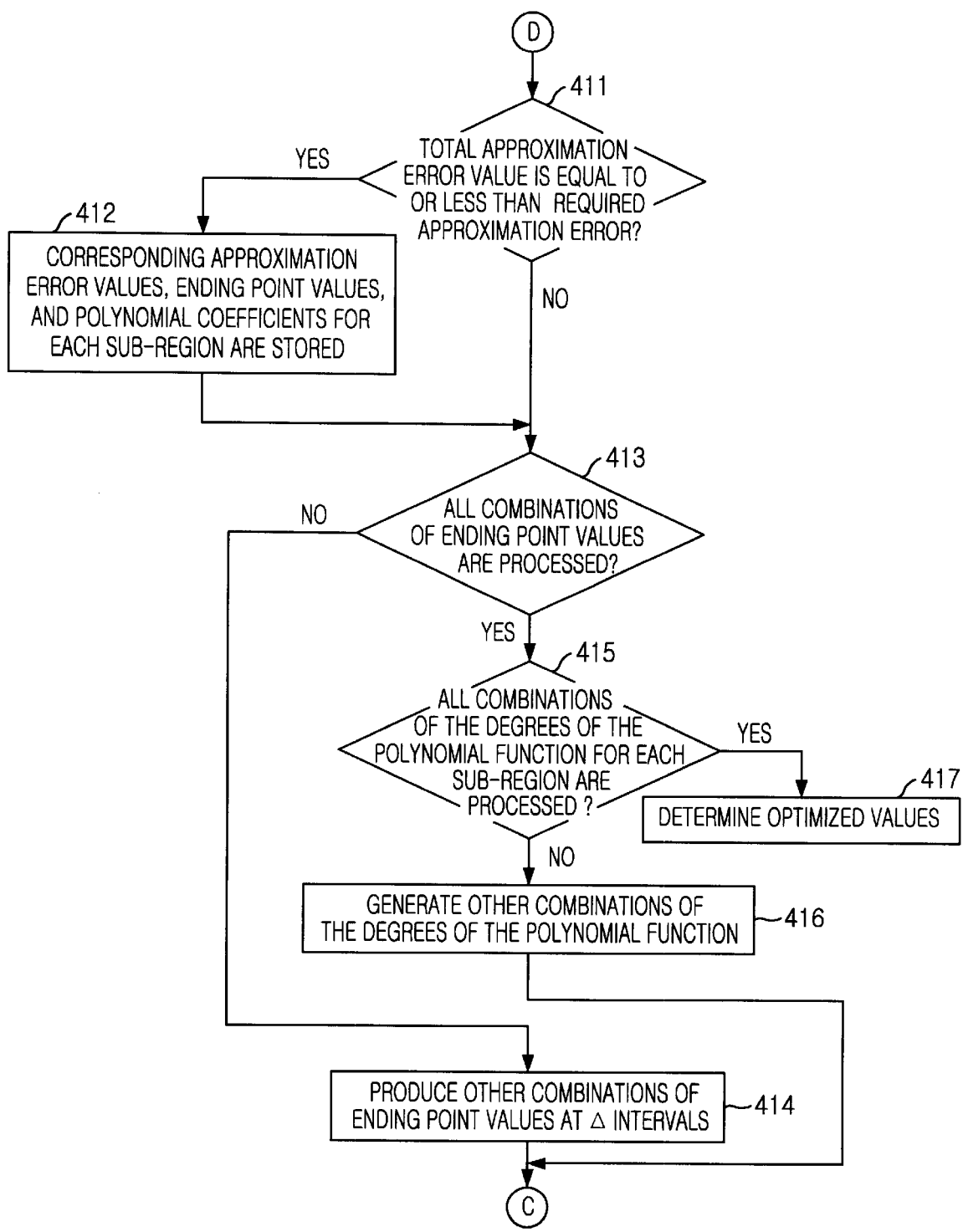
Figure 5:
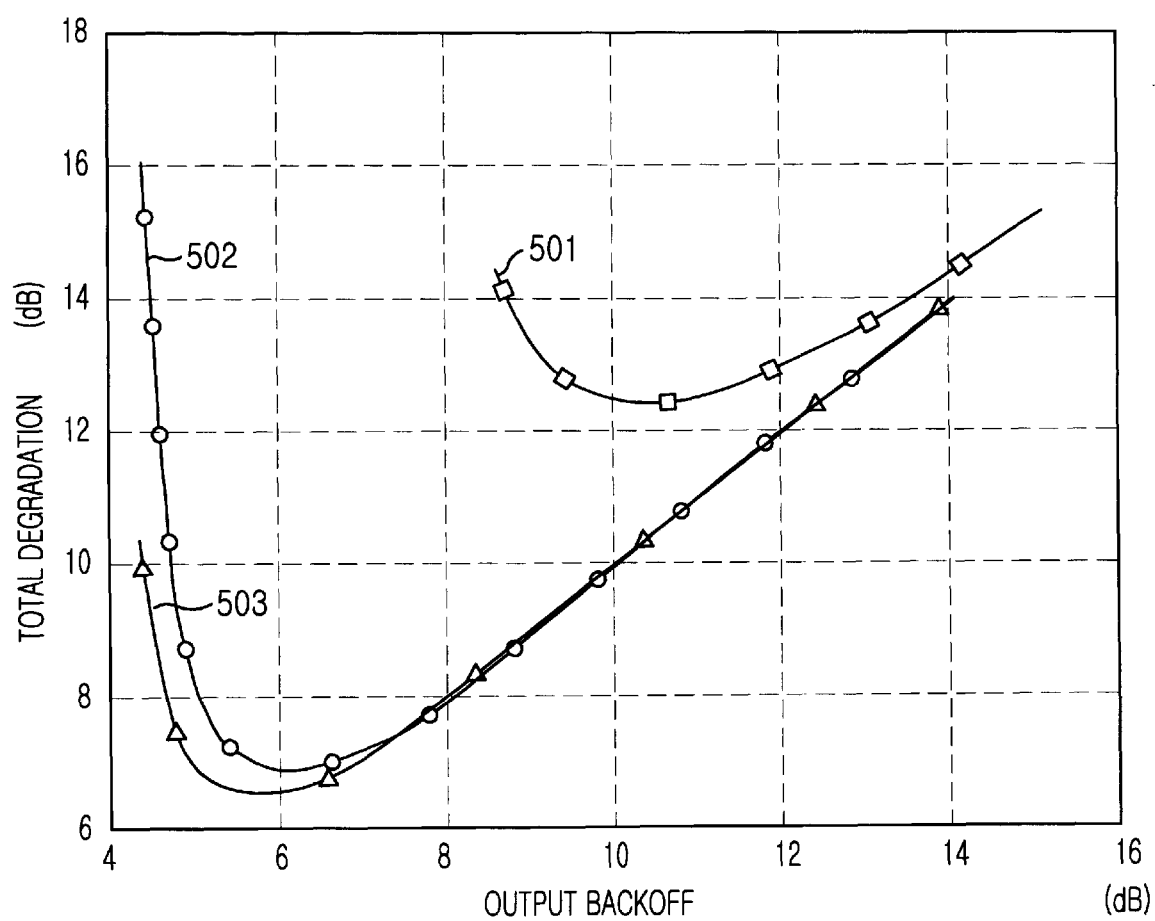

FIGS. 4A and 4B provide a flow chart explaining a process of defining piecewise polynomial functions for sub-regions in accordance with the present invention; and FIG. 5 represents a total degradation plot of an M-QAM OFDM system without predistortion, with one polynomial predistortion and with piecewise predistortion.

DETAILED DESCRIPTION OF THE INVENTION

Other objects and aspects of the invention will become apparent from the following description of the embodiments with reference to the accompanying drawings, which is set forth hereinafter.

Figure 1:
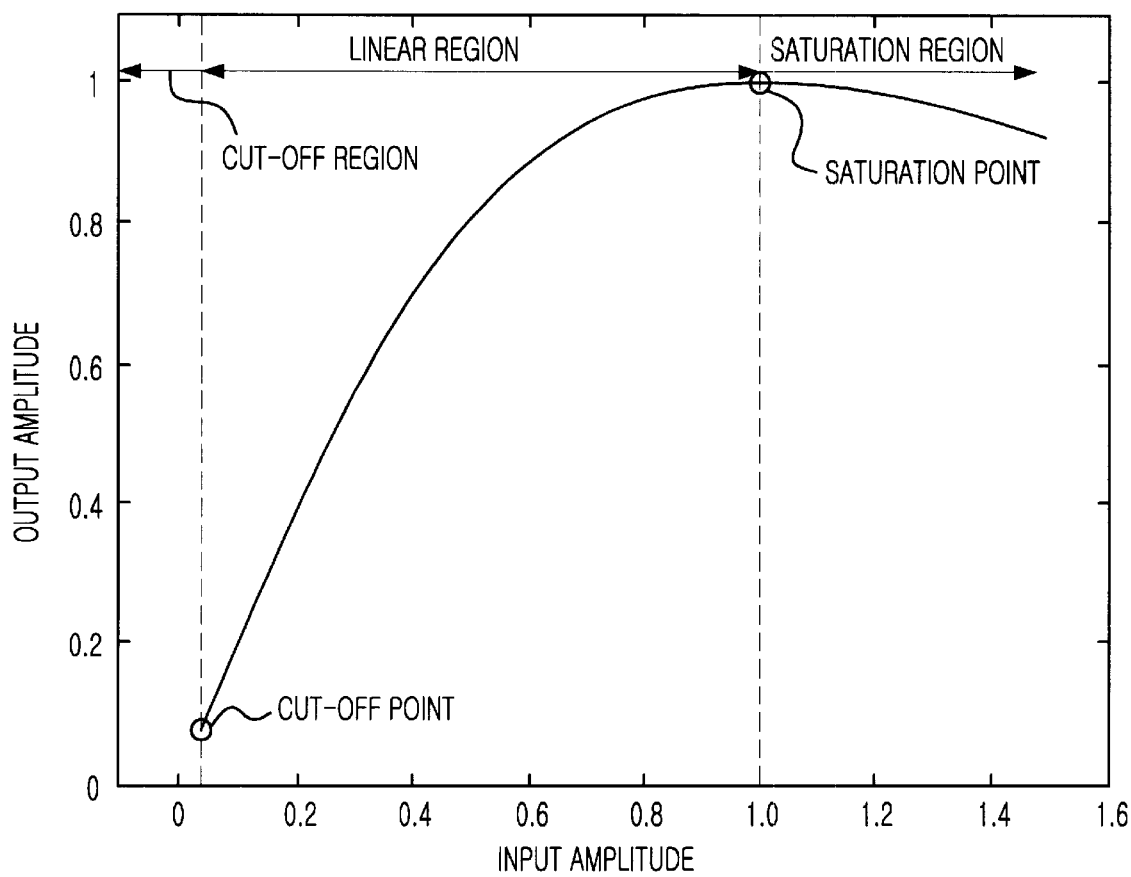
Figure 2:
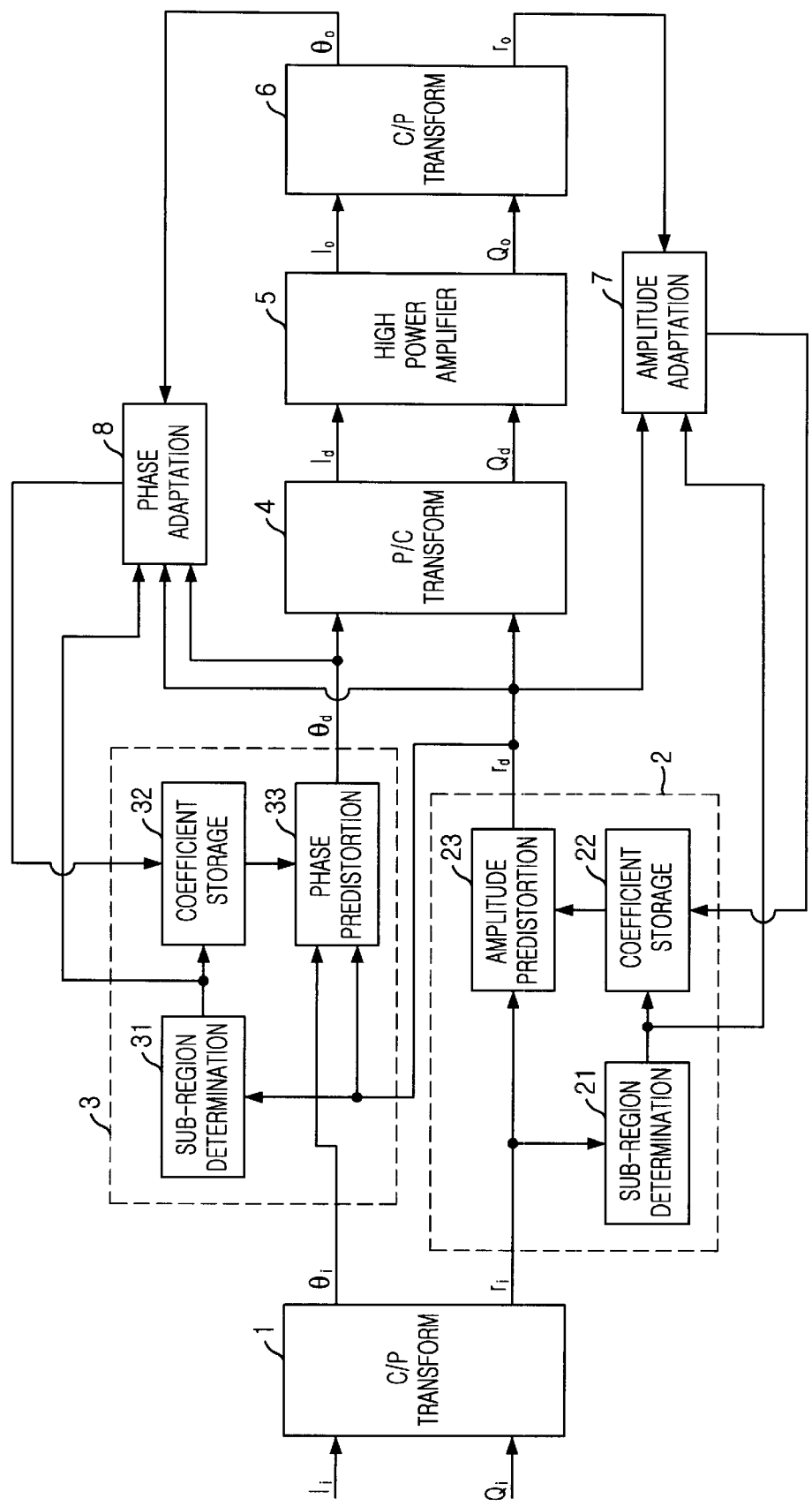
FIG. 2 illustrates a block diagram of a piecewise polynomial predistortion apparatus in accordance with the present invention.

Referring to FIG. 2, there is provided a block diagram of a piecewise polynomial predistortion apparatus for compensating nonlinear distortion of a high power amplifier (HPA) in accordance with a preferred embodiment of the present invention.

The HPA exploits AM/AM and AM/PM characteristics and the predistortion techniques aim to introduce "inverse" nonlinearities that can compensate the. AM/AM and AM/PM distortions generated by the nonlinear characteristics of the HPA. The piedistortion techniques use a memoryless nonlinear device placed in front of the HPA.

However, the HPA exploits distinct characteristics in each of cut-off, linear or active and saturation regions and, therefore, it is very difficult to approximate the function of AM/AM (or AM/PM) by using a single polynomial function in the above three regions of input signals with a small degree of polynomial.

Thus, in accordance with the present invention, the regions of the input signal are divided into a number of sub-regions and a different degree of polynomial functions is used in each sub-region to approximate the inverse characteristics of the HPA.

As shown in FIG. 2, the predistortion apparatus includes a first coordinate transform circuit, i.e., a Cartesian to Polar (C/P) transform circuit 1, for transforming an input complex signal $(I_i, Q_i)$ including an in-phase portion $I_i$ and a quadrature portion $Q_i$ to a transformed complex signal $(r_i, \theta_i)$ including an amplitude portion $r_i$ and a phase portion $\theta_i$, which are provided to an amplitude predistortion circuit 2 and a phase predistortion circuit 3, respectively.

The amplitude predistortion circuit 2 generates a predistorted amplitude signal $r_d$ based on the transformed amplitude signal $r_i$ supplied from the C/P transform circuit 1. The predistorted amplitude signal $r_d$ outputted from the amplitude predistortion circuit 2 is coupled to the phase predistortion circuit 3, a second coordinate transform circuit, i.e., a Polar to Cartesian (P/C) transform circuit 4, amplitude and phase adaptation circuits 7 and 8 in parallel.

The phase predistortion circuit 3 generates a predistorted phase signal $\theta_d$ based on the transformed phase signal $\theta_i$ from the C/P transform circuit 1 and the predistorted amplitude signal $r_d$ from the amplitude predistortion circuit 2. The predistorted phase signal $\theta_d$ outputted from the phase predistortion circuit 3 is supplied to the P/C transform circuit 4 and the phase adaptation circuit 8 in parallel.

The amplitude predistortion circuit 2 includes a sub-region determination unit 21, a coefficient storage unit 22 and an amplitude predistortion unit 23. The, sub-region determination unit 21 decides a sub-region of the, transformed amplitude signal $r_i$ and generates a sub-region indication signal representing the decided sub-region to select coefficients of polynomial stored in the coefficients storage unit 23, wherein the selected polynomial coefficients will be used in a predistortion operation performed in the amplitude predistortion unit 23.

Similarly, the phase predistortion circuit 3 also includes a sub-region determination unit 31, a coefficient storage unit 32 and a phase predistortion unit 33, and the function of each unit in the phase predistortion circuit 3 is almost same as that of a corresponding unit in the amplitude predistortion circuit 2.

The P/C transform circuit 4 transforms the predistorted complex signal $(r_d,\theta_d)$ to a Cartesian complex signal $(I_d,Q_d)$ and delivers it to a high power amplifier 5.

The high power amplifier 5 amplifies the Cartesian complex signal $(I_d,Q_d)$ and provides an amplified complex signal $(I_o,Q_o)$ to a third coordinate transform circuit, i.e., a Cartesian to Polar (C/P) transform circuit 6.

The C/P transform circuit 6 transforms the amplified complex signal $(I_o,Q_o)$ to thereby provide an output complex signal $(r_o,\theta_o)$, which is used as a feedback signal to the amplitude and phase adaptation circuits 7 and 8.

The amplitude adaptation circuit 7 updates the polynomial coefficients stored in the coefficient storage unit 22 based on the sub-region indication signal from the sub-region determination unit 21, the predistorted amplitude signal $r_d$ and the amplitude feedback signal $r_o$, wherein the to-be-updated polynomial coefficients represent the coefficients selected at the coefficient storage unit 22 by the sub-region indication signal provided from the sub-region determination unit 21.

Similarly, the phase adaptation circuit 8 updates the polynomial coefficients stored in the coefficient storage unit 32 based on the sub-region indication signal from the sub-region determination unit 31, the predistorted amplitude signal $r_d$, the predistorted phase signal $\theta_d$ and the phase feedback signal $\theta_o$, wherein the to-be-updated polynomial coefficients represent the coefficients selected at the coefficient storage unit 32 by the sub-region indication signal provided from the sub-region determination unit 31.

Figure 3A:
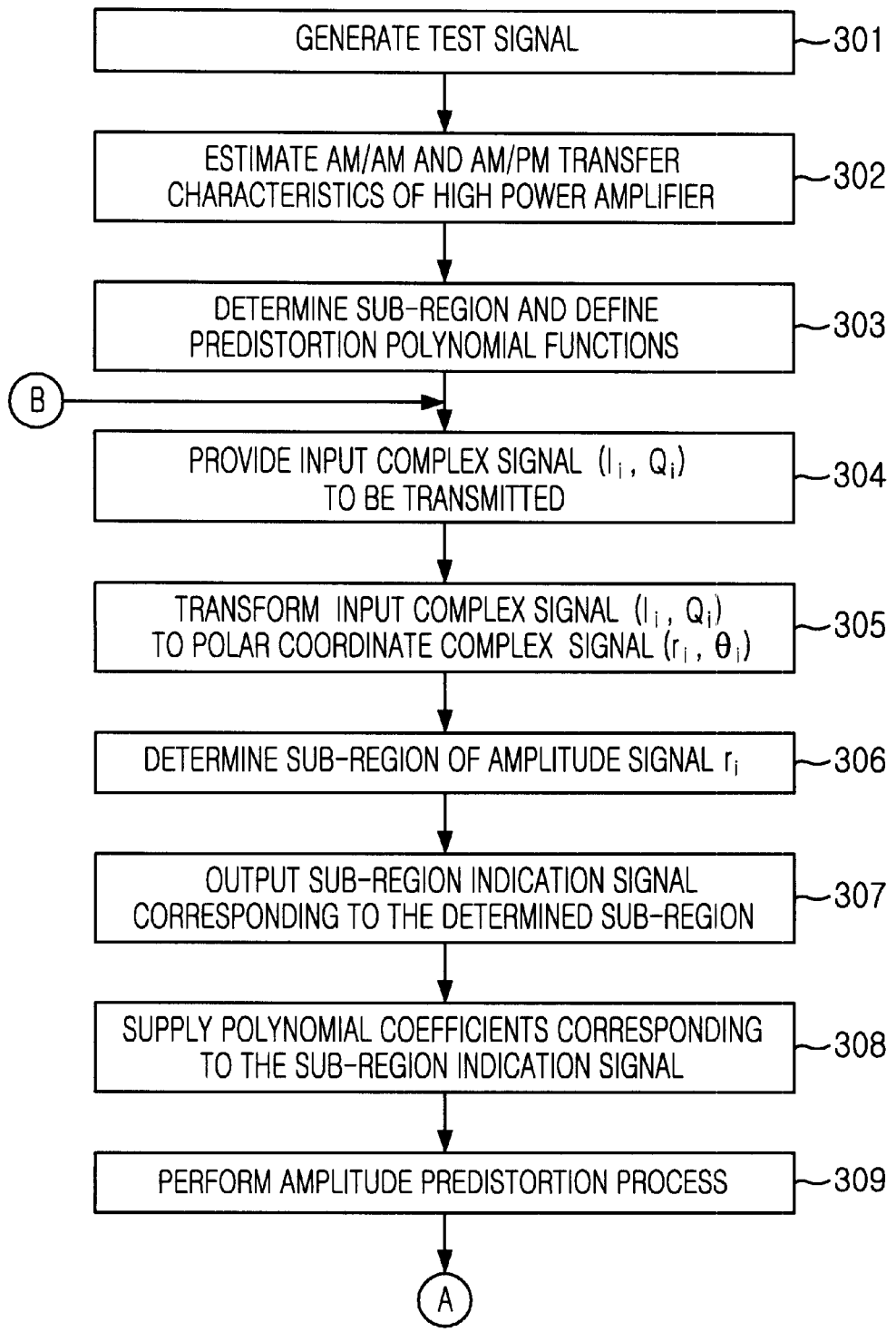
FIGS. 3A and 3B show a flow chart describing a piecewise polynomial predistortion method in accordance with the present invention.
Figure 3B:
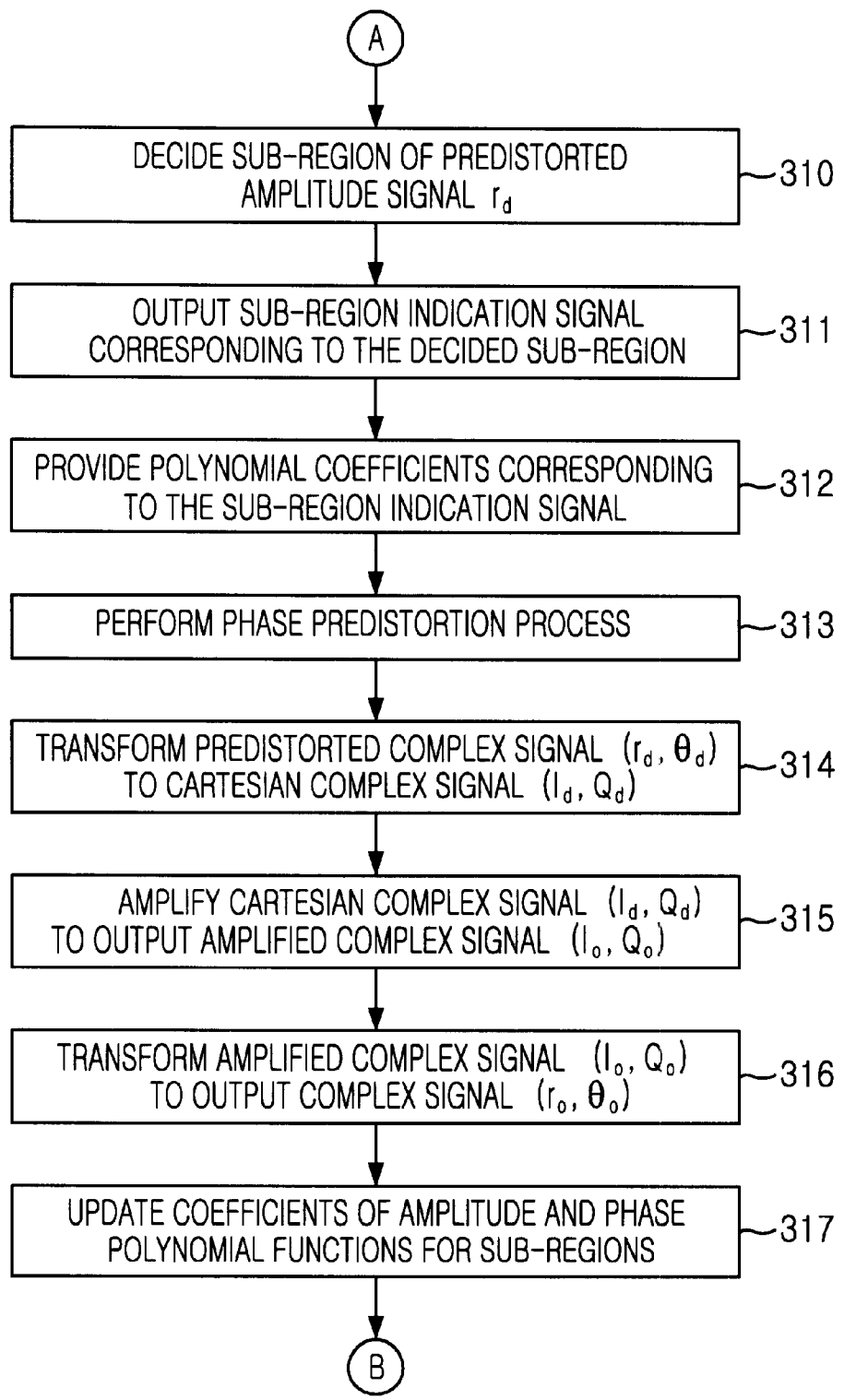

FIGS. 3A and 3B provide a flow chart describing a piecewise polynomial predistortion method in accordance with a preferred embodiment of the present invention.

Hereinafter, referring to FIGS. 3A and 3B, the operation of the piecewise polynomial predistortion apparatus in FIG. 2 will be explained in detail.

First of all, before performing the predistortion process, the piecewise polynomial predistortion apparatus should be initialized.

For the initialization, in step 301, a test signal is generated to grasp transfer characteristics of the high power amplifier 5.

In step 302, there are estimated the AM/AM and AM/PM transfer characteristics of the high power amplifier 5 by using the test signal.

Then, in step 303, there are determined sub-regions corresponding to the amplitude of an input signal according to the AM/AM characteristic of the high power amplifier 5 and there is defined an amplitude predistortion polynomial function for each sub-region by calculating coefficients of the amplitude predistortion polynomial function.

Furthermore, there are decided sub-regions corresponding to the amplitude of the input signal according to the AM/PM characteristic of the high power amplifier 5 and there is defined a phase predistortion polynomial function for each sub-region by calculating coefficients of the phase predistortion polynomial function.

The calculated polynomial coefficients are used as initial values in the following predistortion process.

Referring to FIGS. 4A and 4B, there will be explained in detail the step 303 of determining the sub-regions and defining predistortion polynomial functions corresponding to the sub-regions.

At first, in step 401, a required approximation error $E_{a(req)}$ is set and ideal inverse characteristic functions are secured by using the AM/AM and AM/PM transfer characteristics of the high power amplifier 5 estimated in the step 302 of FIG. 3A.

For instance, the AM/AM and AM/PM characteristics for a traveling wave tube amplifier (TWTA), which is a high power D amplifier used in applications requiring the high power amplification such as a satellite communication system, are represented as follows (see, Saleh, A. A. M., Frequency-independent and frequency-dependent nonlinear models of TWT amplifiers, IEEE Trans. On Communications, Vol. COM-29, November 1981, pp. 1715–1720):

$$A(\rho) = \frac{2\rho}{1+\rho^2} \qquad \text{EQ. 1}$$

$$\Phi(\rho) = \frac{\pi}{3}\frac{\rho^2}{1+\rho^2} \qquad \text{EQ. 2}$$

wherein $A(\rho)$ denotes the AM/AM characteristic; $\Phi(\rho)$ means the AM/PM characteristic; and $\rho$ represents the amplitude of the input signal.

Then, the ideal inverse characteristic functions for the amplitude and the phase of the input signal are obtained based on following equations.

$$r_{d(I)} = A^{-1}(r_i) = \begin{cases} \frac{1}{r_i}\left(1-\sqrt{1-r_i^2}\right) & 0 < r_i \leq 1 \\ 1 & 1 \leq r_i < \infty \end{cases} \qquad \text{EQ. 3}$$

$$\theta_{d(I)} - \theta_i = \Phi(r_{d(I)}) = \frac{\pi}{3}\frac{r_{d(I)}^2}{1+r_{d(I)}^2} \qquad 0 \leq r_{d(I)} \leq 1 \qquad \text{EQ. 4}$$

wherein $r_i$ and $\theta_i$ represent an amplitude signal and a phase signal of the input signal, respectively; and $r_{d(I)}$ and $\theta_{d(I)}$ denote an ideally predistorted amplitude signal and an ideally predistorted phase signal of the input signal, respectively. The equations EQ. 3 and EQ. 4 can be applied to an ideal predistortion process, which uses the ideal inverse characteristic functions.

After then, in step 402, there are estimated probability density functions (PDFs) of the input amplitude signal and its predistorted amplitude signal.

In step 403, a set of internal input signals capable of covering all ranges of the input amplitude signal and a set of internal predistorted signals capable of covering all ranges of the predistorted amplitude signal are generated based on their corresponding PDFS.

Hereinafter, there will be explained only a procedure of determining the number of sub-regions, sub-region points and polynomial coefficients for the sub-regions to be used in performing the amplitude predistortion process for the simplicity of explanation since a procedure of deciding those values to used in executing the phase predistortion process are obtained based on the predistorted amplitude signal and its PDF in a similar manner.

That is, for the input amplitude signal, the number of sub-regions S dividing the regions of the input amplitude signal is determined in step 404 according to the amplitude of the input amplitude signal.

In order to obtain a polynomial function applied to each sub-region, an initial value of the degree of the polynomial function is decided as a maximum value P in step 405.

Subsequently, an ending point of a previously determined sub-region is set as a starting point of a next sub-region. At first, ending point values of all sub-regions, $V_1, V_2, \ldots, V_{S-1}$ are initially set with a minimum interval $\Delta$ of each sub-region in step 406. For example, if $\Delta$ is 0.01, there are determined as $V_1=0.01$, $V_2=0.02$, $V_3=0.03$ and so on. The ending point values $V_1$ to $V_{S-1}$, represent sub-region points of the sub-regions.

Once the sub-regions and the degree of each polynomial function corresponding to each sub-region are set, in step 407, an ideal predistortion value is calculated by using the set of internal input signals generated in the step 403 and the ideal inverse characteristic functions secured in the step 401.

Then, for each sub-region, polynomial coefficients are calculated by utilizing a least mean square (LMS) algorithm in step 408, so that a predistortion polynomial function for each sub-region is decided.

In step 409, an approximated predistortion value is computed by using the set of input signals generated in the step 403 and the predistortion polynomial function for each sub-region determined in the step 408.

In step 410, there is estimated a difference between the ideal predistortion value and the approximated predistortion value, which represents an approximation error value of the polynomial predistortion for each sub-region.

In step 411, there is judged whether or not a total approximation error value is equal to or less than the required approximation error $E_{a(req)}$ set in the step 401. The total approximation error $E_{aT}$ is calculated by the following equation.

$$E_{aT} = \sum_{i=1}^{S} p_i E_{ai} \qquad \text{EQ. 4-1}$$

wherein S represents the number of total sub-regions; $p_i$ represents a percentage of the input amplitude signal in the i-th sub-region; and $E_{ai}$ represents the calculated approximation error in the i-th sub-region.

As a result of the step 411, if the $E_{aT}$ is equal to or less than the $E_{a(req)}$, in step 412, corresponding approximation error value $E_{ai}$, ending point values of sub-regions, and predistortion polynomials for each sub-region are stored.

On the other hand, if $E_{aT}$ is larger than the $E_{a(req)}$, in step 413, there is judged whether or not the processes of the steps 407 to 411 are performed for all combinations of the ending point values $V_1$ to $V_{S-1}$.

As a result of the step 413, if all combinations are not examined, in step 414, other combinations of the ending point values are produced at $\Delta$ intervals and, at this time, an ending point value of a subsequent sub-region should be larger than that of its previous sub-region, i.e., $V_1<V_2, \ldots <V_{S-1}$.

On the other hand, if it is determined in the step 413 that all combinations are examined, in step 415, it is judged whether or not the processes of the steps 407 to 413 are implemented for all combinations of the degrees of the polynomial function for each sub-region.

If it is decided in the step 415 that all combinations are not examined, other combinations of the degrees of the polynomial function for each sub-region are generated in step 416 and the processes of the steps 407 to 413 are repeated for the other combinations.

On the other hand, if it is determined in the step 415 that all combinations are examined, in step 417, optimized ending point values, the degree of polynomial function and the coefficients of the polynomial function for each sub-region are selected among the stored values in the step 412. The optimized values are selected by the following rules: (a) the degree of polynomial function is minimum; and (b) $E_{aT}$ is the minimum amongst.

In the above description for FIGS. 4A and 4B, although there is mainly explained for the procedure of determining the optimized values for the sub-regions to be used in performing the amplitude predistortion process for the simplicity of explanation, as afore-mentioned, optimized values for sub-regions to be used in executing the phase predistortion process are also obtained based on the predistorted amplitude signal in the similar manner described above with reference to FIGS. 4A and 4B.

The optimized values for the sub-regions obtained from the above procedures are stored in the piecewise polynomial predistortion apparatus as the initial values to be used in performing the predistortion process in the amplitude and the phase predistortion circuits 2 and 3. In addition, these values are also stored initially in the amplitude and the phase adaptation circuits 7 and 8 for an adaptation process.

Once there are defined the predistortion polynomial functions for the sub-regions according to the amplitude and the phase of the input signal by determining the optimized values in the step 415, the initialization of the piecewise polynomial predistortion apparatus is completed.

Referring back to FIG. 3A, in step 304, the input complex signal $(I_i,Q_i)$ is inputted to the first coordinate transform circuit 1 in the predistortion apparatus illustrated in FIG. 2.

Then, in step 305, the input complex signal $(I_i,Q_i)$ is transformed to the polar coordinate complex signal $(r_i,\theta_i)$ including the amplitude portion $r_i$ and the phase portion $\theta_i$, which are provided to the amplitude predistortion circuit 2 and the phase predistortion circuit 3, respectively.

Once the amplitude signal $t_i$ coupled to the amplitude predistortion circuit 2, the sub-region determination unit 21 decides a sub-region of the input amplitude signal $r_i$ inputted thereto among the predetermined sub-regions in step 306 and provides the coefficient storage unit 22 with a sub-region indication signal representing the sub-region of the amplitude signal $r_i$ in step 307.

The coefficient storage unit 22 supplies polynomial coefficients corresponding to the sub-region indication signal to the amplitude predistortion unit 23 in step 308.

Referring to FIG. 3A, in step 309, the amplitude predistortion unit 23 performs the amplitude predistortion process for the amplitude signal $r_i$ by using the polynomial coefficients provided from the coefficient storage unit 22 and produces the predistorted amplitude signal $r_d$ as follows:

$$r_d = F^{(k)}(r_i) = a_{N_k}^{(k)} r_i^{N_k} + a_{N_k-1}^{(k)} r_i^{N_k-1} + \ldots + a_1^{(k)} r_i + a_0^{(k)} \qquad \text{EQ. 5}$$

This function is used to approximate the inverse transfer function of the AM/AM characteristics of the high power amplifier 5. In equation EQ. 5, $N_k$ represents a degree of the polynomial function in a k-th sub-region and $a_n^{(k)}$, n being 0, 1, ..., and $N_k$, represent the coefficients of the polynomial function, which were selected by the sub-region indication signal at the coefficient storage unit 22. In the coefficient storage unit 22, there are stored polynomial coefficients $a_n^{(k)}$, n being 0, 1, ..., and $N_k$, for each sub-region of the amplitude signal $r_i$, which were predetermined according to the process described in FIGS. 4A and 4B.

After the amplitude predistortion process in the amplitude predistortion circuit 2 is completed, the predistortion process for the phase is executed in the phase predistortion circuit 3.

At first, referring to FIG. 3B, the sub-region determination unit 31 decides a sub-region of the predistorted amplitude signal $r_d$ in step 310 and generates a sub-region indication signal for the decided sub-region to the coefficient storage unit 32 in step 311.

Subsequently, in response to the sub-region indication signal provided thereto, the coefficient storage unit 32 provides polynomial coefficients corresponding to the sub-region indication signal to the phase predistortion unit 33 in step 312.

In step 313, the phase predistortion unit 33 performs the predistortion process for the phase by using the predistorted amplitude signal $r_d$ and the polynomial coefficients provided from the coefficient storage unit 32, and produces the predistorted phase signal $\theta_d$ as follows:

$$\theta_d = P^{(l)}(r_d) = b_{M_l}^{(l)} r_d^{M_l} + b_{M_l-1}^{(l)} r_d^{M_l-1} + \ldots + b_1^{(l)} r_d + b_0^{(l)} \quad \text{EQ. 6}$$

This function is used to approximate the inverse transfer function of the AM/PM characteristics of the high power amplifier 5. In equation EQ. 6, $M_l$ represents a degree of the polynomial function in an l-th sub-region and $b_n^{(l)}$, n being 0, 1, ..., and $M_l$, represent relevant coefficients of the polynomial function, which were selected by the sub-region indication signal at the coefficient storage unit 32. In the coefficient storage unit 32, there are stored polynomial coefficients $b_n^{(l)}$, n being 0, 1, ..., and $M_l$, for each sub-region of the predistorted amplitude signal $r_d$, which were predetermined according to the process described in FIGS. 4A and 4B.

The predistorted amplitude and phase signals $r_d$ and $\theta_d$ are provided to the second coordinate transform circuit 4, which, in turn, transforms the predistorted complex signal $(r_d, \theta_d)$ to the Cartesian complex signal $(I_d, Q_d)$ and delivers it to the high power amplifier 5 in step 314.

In step 315, the high power amplifier 5 amplifies the Cartesian complex signal $(I_d, Q_d)$ and outputs an amplified complex signal $(I_o, Q_o)$ to the third coordinate transform circuit 6.

In step 316, the third coordinate transform circuit 6 converts the amplified complex signal $(I_o, Q_o)$ to the output complex signal $(r_o, Q_o)$, which is coupled to the adaptation circuits 7 and 8.

In step 317, the amplitude and phase adaptation circuits 7 and 8 update the polynomial coefficients stored in the coefficient storage units 22 and 32 according to state variations of the high power amplifier 5 by using the predistorted complex signal $(r_d, \theta_d)$ and the output complex signal $(r_o, Q_o)$.

Specifically, as before-mentioned, the amplitude adaptation circuit 7 updates the polynomial coefficients stored in the coefficient storage unit 22 by employing, e.g., a recursive least square (RLS) algorithm, in a direction of minimizing an amplitude approximation error $E_A$ shown in an equation EQ. 7 based on the predistorted amplitude signal $r_d$ and the amplitude feedback signal $r_o$, and pre-stored predistortion polynomials, and adapting the inverse characteristics of the amplitude.

Similarly, the phase adaptation circuit 8 updates the polynomial coefficients stored in the coefficient'storage unit 32 by employing, e.g., the RLS algorithm, in a direction of minimizing a phase approximation error $E_P$ represented in an equation EQ. 8 based on the predistorted amplitude signal $r_d$, the predistorted phase signal $\theta_d$ and the phase feedback signal $\theta_o$ and adapting the inverse characteristics of the phase.

$$E_A = E[|e_r^{(k)}|^2] \quad \text{EQ. 7}$$

$$E_P = E[|e_\theta^{(l)}|^2] \quad \text{EQ. 8}$$

wherein $$e_r^{(k)}(n) = r_d(n) - F_n^{(k)}(r_o(n)) \quad \text{EQ. 9}$$

$$e_\theta^{(l)}(n) = \theta_o(n) - \theta_d(n) - P_n^{(l)}(r_d(n)) \quad \text{EQ. 10}$$

where $F_n^k(x)$ and $P_n^l(y)$ are predistortion polynomials in EQ. 5 and EQ. 6.

To minimize the errors in equations EQ. 7 and EQ. 8, there are a number of algorithms capable of being used, and, in accordance with the preferred embodiment of the present invention, the RLS algorithm is used.

In accordance with the present invention, the errors in equations EQ. 7 and EQ. 8 are functions of the number of sub-regions, sub-region points and the degree of polynomial functions. These parameters are determined before the practical predistortion operation and the polynomial coefficients for the sub-regions are modified by the amplitude and phase adaptation circuits 7 and 8 in FIG. 2 during the practical predistortion operation.

The above practical predistortion processes are iteratively performed for subsequent input signals.

FIG. 5 shows a total degradation plot of a 16-QAM 512-point OFDM system without predistortion, with a single polynomial predistortion, and with an inventive piecewise polynomial predistortion.

A reference numeral 501 represents the case without predistortion; a reference numeral 502, the case with the single polynomial predistortion; and a reference numeral 503, the case with the piecewise polynomial predistortion.

Both the single polynomial predistortion and the piecewise polynomial predistortion compensate the nonlinearity of the amplifier well. Compared to the single polynomial predistortion, there is obtained a 0.5 dB output backoff gain when using the piecewise polynomial predistortion. This gain is resulted from a low output backoff value in the saturation region.

In addition to this performance enhancement, the computational burden resulted from the predistortion can be reduced by using the present invention.

This is because, in the piecewise predistortion method, the order of polynomial functions in the linear region is largely reduced at the expense of increase in the polynomial order in the saturation region, and the most of the input signals are in the linear region rather than the saturation region. As a result, the total amount of computations can be reduced.

While the present invention has been described with respect to certain preferred embodiments, it will be apparent to those skilled in the art that various changes and modifications may be made without departing from the scope of the invention as defined in the following claims.

What is claimed is:

1. A polynomial predistortion apparatus, comprising:
   an amplitude predistortion circuit for predistorting an input amplitude signal based on first polynomial coefficients selected according to the amplitude of the input amplitude signal to thereby provide a predistorted amplitude signal;

a phase predistortion circuit for predistorting an input phase signal based on the predistorted amplitude signal and second polynomial coefficients selected according to the amplitude of the predistorted amplitude signal to thereby provide a predistorted phase signal;

a power amplifier for amplifying the predistorted amplitude signal and the predistorted phase signal to thereby output an amplified amplitude signal and an amplified phase signal;

a first adaptation circuit for updating the first polynomial coefficients based on the predistorted amplitude signal and the amplified amplitude signal; and a second adaptation circuit for updating the second polynomial coefficients based on the predistorted amplitude signal, the predistorted phase signal and the amplified phase signal.

2. The apparatus of claim 1, wherein the amplitude predistortion circuit includes:

a sub-region determination unit for deciding a sub-region of the input amplitude signal to thereby generate a sub-region indication signal representing the decided sub-region, wherein said sub-region is decided according to the amplitude of the input amplitude signal and a plurality of sub-regions is preset for the input amplitude signal;

a coefficient storage unit for selecting and outputting the first polynomial coefficients corresponding to said sub-region indication signal among polynomial coefficients stored therein, wherein the polynomial coefficients are predetermined for each of the sub-regions; and an amplitude predistortion unit for predistorting the input amplitude signal to output the predistorted amplitude signal by using the input amplitude sign al and the first polynomial coefficients provided from said coefficient storage unit.

3. The apparatus of claim 2, wherein the predistorted amplitude signal is estimated according to a following polynomial function:

$$r_d = F^{(k)}(r_i) = a_{N_k}^{(k)} r_i^{N_k} + a_{N_k-1}^{(k)} r_i^{N_k-1} + \ldots + a_1^{(k)} r_i + a_0^{(k)}$$

wherein $r_i$ shows the input amplitude signal; $r_d$ represents the predistorted amplitude signal; $N_k$ depicts a degree of the polynomial function in a k-th sub-region of the input amplitude signal; and $a_n^{(k)}$, n being 0, 1, ..., and $N_k$, represents the polynomial coefficients corresponding to the sub-region indication signal.

4. The apparatus of claim 2, wherein the first adaptation circuit updates the first polynomial coefficients by employing a recursive least square (RLS) algorithm in a direction of minimizing an amplitude approximation error based on the predistorted amplitude signal and the amplified amplitude signal, the amplitude approximation error representing a difference between the predistorted amplitude signal and the amplified amplitude signal.

5. The apparatus of claim 4, wherein the amplitude approximation error $E_A$ is determined as follows:

$$E_A = E[|e_r^{(k)}|^2] \; e_r^{(k)}(n) = r_d(n) - F_n^{(k)}(r_o(n))$$

wherein $F_n^k(x)$ denotes the predistortion polynomial used in estimating the predistorted amplitude signal $r_d$.

6. The apparatus of claim 2, wherein the number of sub-regions, sub-region points and the degree of the polynomial function for estimating the predistorted amplitude signal are decided according to the steps of:

(a) providing a test signal to the power amplifier;

(b) calculating an amplitude-dependent amplitude distortion (AM/AM) transfer function of the power amplifier by measuring input and output of the power amplifier based on the test signal and estimating a probability density function (PDF) of the input amplitude signal;

(c) obtaining an ideal inverse amplitude, distortion transfer function of the power amplifier;

(d) calculating total approximation error values of polynomial functions with all combinations of the sub-region points and all combinations of the degrees of the polynomial function for each sub-region, wherein the number of the sub-regions is resulted from the sub-region points and the coefficients of the polynomial functions for each sub-region are calculated by using internal input signals generated based on said estimated PDF and a least mean square (LMS) algorithm;

(e) storing the total approximation error values, the sub-region points, and the coefficients of the polynomial functions for each sub-region if the calculated total approximation error values are equal to or less than a required approximation error value; and (f) among the stored values, selecting optimum sub-region points and polynomial coefficients for each sub-region with the minimum polynomial degree and the minimum total approximation error value.

7. The apparatus of claim 1, wherein the phase predistortion circuit includes:

a sub-region determination unit for determining a sub-region of the predistorted amplitude signal to thereby generate a sub-region indication signal representing the determined sub-region, wherein said sub-region is determined according to the amplitude of the predistorted amplitude signal and a multiplicity of sub-regions is predetermined for the predistorted amplitude signal;

a coefficient storage unit for selecting and outputting the second polynomial coefficients corresponding to said sub-region indication signal among polynomial coefficients stored therein, wherein the polynomial coefficients are predetermined for each of the sub-regions; and a phase predistortion unit for predistorting the input phase signal to output the predistorted phase signal by using the input phase signal, the predistorted amplitude signal and the second polynomial coefficients provided from said coefficient storage unit.

8. The apparatus of claim 7, wherein the predistorted phase signal is estimated according to a following polynomial function:

$$\theta_d = P^{(l)}(r_d) = b_{M_l}^{(l)} r_d^{M_l} + b_{M_l-1}^{(l)} r_d^{M_l-1} + \ldots + b_1^{(l)} r_d + b_0^{(l)}$$

wherein $\theta_d$ shows the predistorted phase signal; $r_d$ means the predistorted amplitude signal; $M_l$ represents a degree of the polynomial function in an l-th sub-region of the predistorted amplitude signal; and $b_n^{(l)}$, n being 0, 1, ..., and $M_l$, represents the polynomial coefficients corresponding to the sub-region indication signal.

9. The apparatus of claim 7, wherein the second adaptation circuit updates the second polynomial coefficients by employing a recursive least square (RLS) algorithm in a direction of minimizing a phase approximation error based on the predistorted amplitude signal, the predistorted phase signal and the amplified phase signal, the phase approximation error representing a difference between the predistorted phase signal and the amplified phase signal.

10. The apparatus of claim 9, wherein the phase approximation error $E_P$ is determined as follows:

$$E_P = E[|e_\theta^{(l)}|^2] \; e_\theta^{(l)}(n) = \theta_o(n) - \theta_d(n) - P_n^{(l)}(r_d(n))$$

wherein $P_n^l(y)$ denotes the predistortion polynomial used in estimating the predistorted phase signal $\theta_d$.

11. The apparatus of claim 7, wherein the number of sub-regions, sub-region points and the degree of the polynomial function for estimating the predistorted phase signal are determined according to the steps of:

(a) providing a test signal to the power amplifier;
(b) calculating an amplitude-dependent phase distortion (AM/PM) transfer function of the power amplifier by measuring input and output of the power amplifier based on the test signal and estimating a probability density function (PDF) of the predistorted amplitude signal;
(c) obtaining an ideal inverse phase distortion transfer function of the power amplifier;
(d) calculating total approximation error values of polynomial functions with all combinations of the sub-region points and all combinations of the degrees of the polynomial function for each sub-region, wherein the number of the sub-regions is resulted from the sub-region points and the coefficients of the polynomial functions for each sub-region are calculated by using internal predistorted signals generated based on said estimated PDF and a least mean square (LMS) algorithm;
(e) storing the total approximation error values, the sub-region points, and the coefficients of the polynomial functions for each sub-region if the calculated total approximation error values are equal to or less than a required approximation error value; and
(f) among the stored values, selecting optimum sub-region points, and polynomial coefficients for each sub-region with the minimum polynomial degree and the minimum total approximation error value.

12. A polynomial predistortion method, comprising the steps of:

(a) receiving an input amplitude signal and an input phase signal;
(b) predistorting the input amplitude signal by using first polynomial coefficients selected according to the amplitude of the input amplitude signal to generate a predistorted amplitude signal;
(c) predistorting the input phase signal by using the predistorted amplitude signal and second polynomial coefficients selected according to the amplitude of the predistorted amplitude signal to produce a predistorted phase signal;
(d) amplifying the predistorted amplitude signal and the predistorted phase signal to provide an amplified amplitude signal and an amplified phase signal;
(e) updating the first polynomial coefficients by using the predistorted amplitude signal and the amplified amplitude signal; and
(f) updating the second polynomial coefficients by using the predistorted amplitude signal, the predistorted phase signal and the amplified phase signal.

13. The method as recited in claim 12, wherein the step (b) includes the steps of:

(b1) deciding a sub-region of the input amplitude signal to thereby generate a sub-region indication signal representing the decided sub-region, wherein said sub-region is decided according to the amplitude of the input amplitude signal and a plurality of sub-regions is preset for the input amplitude signal;
(b2) selecting and outputting the first polynomial coefficients corresponding to said sub-region indication signal among polynomial coefficients predetermined for the plurality of sub-regions; and
(b3) predistorting the input amplitude signal to output the predistorted amplitude signal by using the input amplitude signal, the first polynomial coefficients provided from said coefficient storage unit.

14. The method as recited in claim 13, wherein the predistorted amplitude signal is estimated according to a following polynomial function:

$$r_d = F^{(k)}(r_i) = a_{N_k}^{(k)} r_i^{N_k} + a_{N_k-1}^{(k)} r_i^{N_k-1} + \ldots + a_1^{(k)} r_i + a_0^{(k)}$$

wherein $r_i$ shows the input amplitude signal; $r_d$ represents the predistorted amplitude signal; $N_k$ depicts a degree of the polynomial function in a k-th sub-region of the input amplitude signal; and $a_n^{(k)}$, n being $0, 1, \ldots$, and $N_k$, represents the polynomial coefficients corresponding to the sub-region indication signal.

15. The method as recited in claim 13, wherein the first polynomial coefficients are updated by employing a recursive least square (RLS) algorithm in a direction of minimizing an amplitude approximation error based on the predistorted amplitude signal and the amplified amplitude, signal, the amplitude approximation error representing a difference between the predistorted amplitude signal and the amplified amplitude signal.

16. The method as recited in claim 15, wherein the amplitude approximation error $E_A$ is determined as follows:

$$E_A = E[|e_r^{(k)}|^2] \; e_r^{(k)}(n) = r_d(n) - F_n^{(k)}(r_o(n))$$

wherein $F_n^k(x)$ denotes the predistortion polynomial used in estimating the predistorted amplitude signal $r_d$.

17. The method as recited in claim 13, wherein the number of sub-regions, sub-region points and the degree of the polynomial function for estimating the predistorted amplitude signal are decided according to the steps of:

(p) providing a test signal to a power amplifier;
(q) calculating an amplitude-dependent amplitude distortion (AM/AM) transfer function of the power amplifier by measuring input and output of the power amplifier based on the test signal and estimating a probability density function (PDF) of the input amplitude signal;
(r) obtaining an ideal inverse amplitude distortion transfer function of the power amplifier;
(s) calculating total approximation error values of polynomial functions with all combinations of the sub-region points and all combinations of the degrees of the polynomial function for each sub-region, wherein the number of the sub-regions is resulted from the sub-region points and the coefficients of the polynomial functions for each sub-region are calculated by using internal input signals generated based on said estimated PDF and a least mean square (LMS) algorithm;
(t) storing the total approximation error values, the sub-region points, and the coefficients of the polynomial functions for each sub-region if the calculated total approximation error values are equal to or less than a required approximation error value; and (u) among the stored values, selecting optimum sub-region points and polynomial coefficients for each sub-region with the minimum polynomial degree and the minimum total approximation error value.

18. The method as recited in claim 12, wherein the step (c) includes the steps of:

(c1) determining a sub-region of the predistorted amplitude signal to thereby generate a sub-region indication signal representing the determined sub-region, wherein said sub-region is determined according to the amplitude of the predistorted amplitude signal and a multiplicity of sub-regions is predetermined for the predistorted amplitude signal;

(c2) selecting and outputting the second polynomial coefficients corresponding to said sub-region indication signal among polynomial coefficients are predetermined for the multiplicity of sub-regions; and (c3) predistorting the input phase signal to output the predistorted phase signal by using the input phase signal, the predistorted amplitude signal and the second polynomial coefficients.

19. The method as recited in claim 18, wherein the predistorted phase signal is estimated according to a following polynomial function:

$$\theta_d = P^{(l)}(r_d) = b_{M_l}^{(l)} r_d^{M_l} + b_{M_l-1}^{(l)} r_d^{M_l-1} + \ldots + b_1^{(l)} r_d + b_0^{(l)}$$

wherein $\theta_d$ shows the predistorted phase signal; $r_d$ means the predistorted amplitude signal; $M_l$ represents a degree of the polynomial function in an l-th sub-region of the predistorted amplitude signal; and $b_n^{(l)}$, n being $0, 1, \ldots,$ and $M_l$, represents the polynomial coefficients corresponding to the sub-region indication signal.

20. The method as recited in claim 18, wherein the second polynomial coefficients are updated by employing a recursive least square (RLS) algorithm in a direction of minimizing a phase approximation error based on the predistorted amplitude signal, the predistorted phase signal and the amplified phase signal, the phase approximation error representing a difference between the predistorted phase signal and the amplified phase signal.

21. The method as recited in claim 20, wherein the phase approximation error $E_P$ is determined as follows:

$$E_P = E[|e_\theta^{(l)}|^2] \quad e_\theta^{(l)}(n) = \theta_o(n) - \theta_d(n) - P_n^{(l)}(r_d(n))$$

wherein $P_n^{l}(y)$ denotes the predistortion polynomial used in estimating the predistorted phase signal $\theta_d$.

22. The method as recited in claim 18, wherein the number of sub-regions, sub-region points and the degree of the polynomial function for estimating the predistorted phase signal are determined according to the steps of:

(p) providing a test signal to a power amplifier;

(q) calculating an amplitude-dependent phase distortion (AM/PM) transfer function of the power amplifier by measuring input and output of the power amplifier based on the test signal and estimating a probability density function (PDF) of the predistorted amplitude signal;

(r) obtaining an ideal inverse phase distortion transfer function of the power amplifier;

(s) calculating total approximation error values of polynomial functions with all combinations of the sub-region points and all combinations of the degrees of the polynomial function for each sub-region, wherein the number of the sub-regions is resulted from the sub-region points and the coefficients of the polynomial functions for each sub-region are calculated by using internal predistorted signals generated based on said estimated PDF and a least mean square (LMS) algorithm;

(t) storing the total approximation error values, the sub-region points, and the coefficients of the polynomial functions for each sub-region if the calculated total approximation error values are equal to or less than a required approximation error value; and (u) among the stored values, selecting optimum sub-region points, and polynomial coefficients for each sub-region with the minimum polynomial degree and the minimum total approximation error value.

* * * * *